(12) United States Patent
Li et al.

(10) Patent No.: US 8,416,966 B2
(45) Date of Patent: Apr. 9, 2013

(54) METHOD OF AUTOMATIC GAIN MODULATION AND APPARATUS IMPLEMENTING THE SAME

(75) Inventors: An Pang Li, Taipei County (TW); Chih-Lung Chen, Taoyuan County (TW); Chun Hsien Su, Kaohsiung (TW)

(73) Assignee: C-Media Electronics Inc., Taipei (TW)

( * ) Notice: Subject to any disclaimer, the term of this patent is extended or adjusted under 35 U.S.C. 154(b) by 393 days.

(21) Appl. No.: 12/899,830

(22) Filed: Oct. 7, 2010

(65) Prior Publication Data

US 2011/0121879 A1     May 26, 2011

(30) Foreign Application Priority Data

Nov. 25, 2009    (TW) .................................. 98140146 A

(51) Int. Cl.
*H03G 3/00*     (2006.01)
(52) U.S. Cl.
USPC ......................................................... 381/107
(58) Field of Classification Search ........................ None
See application file for complete search history.

(56) References Cited

U.S. PATENT DOCUMENTS 6,122,331 A * 9/2000 Dumas ........................... 375/345

\* cited by examiner

*Primary Examiner* — Duc Nguyen
*Assistant Examiner* — Anita Masson
(74) *Attorney, Agent, or Firm* — Rosenberg, Klein & Lee

(57) ABSTRACT

Provided is method for automatic audio gain modulation and a related apparatus. In order to prevent the unstable signals as continuously increasing or decreasing the gain when the signals hover around an upper threshold, it's featured that the method is to predict the signal intensity as pre-adding a predict gain in a hold time before outputting signals. By determining whether the prediction exceeds a predetermined threshold or not, the suitable and adjustable gains can be obtained without exceeding the predetermined threshold. In the automatic gain control mechanism, it's to decrease the gain gradually as automatically entering an attack time, or to increase the gain gradually as performing a conventional auto-gain control procedure including entering a release time. The claimed method can modulate the gain automatically by predicting the gain, and confine the signals under a threshold. In addition to avoid sawtooth phenomena, the method can stabilize the signals.

19 Claims, 8 Drawing Sheets

METHOD OF AUTOMATIC GAIN MODULATION AND APPARATUS IMPLEMENTING THE SAME

BACKGROUND OF THE INVENTION

1. Field of the Invention

The present invention relates to a method of automatic gain modulation and an apparatus implementing the same, more particularly to prevent the unstable state under a conventional auto-gain mechanism and to hold the signal under an upper threshold when the audio signal is around a crackle state.

2. Description of Related Art

Automatic gain control (AGC) technology has been applied to many electronic devices, especially the devices having audio outputs. According to the automatic gain control mechanism, an average output signal of the electronic device is fed back to an input end for modulating a gain for the input signal. In doing so, the electronic device may decrease the overly high sound volume, or increase the overly low one. Therefore, the electronic device may create a superior audience experience even when dealing with the output audio signal of widely spread distribution of the sound intensity.

The above-mentioned automatic gain-control mechanism can also be used for recording technology. Through the automatic gain modulation as approaching the over-high volume, the recording can get better quality. For example, if an unpredictably spike in terms of a sound volume of an audio signal occurs over the course of the recording, such automatic gain control mechanism may make an adjustment to that particular part of the audio signal. The immediate automatic gain-modulation mechanism can prevent the uncomfortable condition.

The automatic gain-control mechanism has a predetermined gain. When the volume exceeds a threshold causing a crackle, the automatic gain control mechanism could be activated from an idle state to enter into an attack time. In the meantime, a common automatic gain-control mechanism will be activated from an idle state and an attack time is entered. The gain is gradually decreased with the passage of time. After a specific period of time, a hold time is entered. The gain will not be modulated in the hold time. Then a release time is entered when the gain holds for a while, and the gain is gradually increased to the predetermined gain by the automatic gain-control mechanism. After that, the automatic gain-control mechanism goes back to the idle state. It is noted that the gain can be a positive value or a negative value.

FIG. 1 describes a signal processed by a conventional automatic gain-control modulation. The original audio signal is originally under a stable output state. When the intensity of a sudden signal is greater than the maximum upper threshold, an automatic gain-control mechanism is activated. Such as the above description, the gain is gradually decreased as entering the attack time. Next, it enters the hold time. After a specific period of time, the release time is entered. As shown in the diagram, when the intensity approaches the maximum upper threshold, the intensity may exceed the maximum upper threshold since the gain will be increased by an enhance gain within the release time.

Thus, the automatic gain-control mechanism will drive the sound enter the attack time if the intensity may exceed the maximum upper threshold. The intensity can be decreased by a specific gain as entering the attack time. Then the sound enters the hold time and the release time for adding the enhance gain. However, the mechanism may make the sound fluctuated around the maximum upper threshold and cause the volume frequently enter the attack time for decreasing gain and the release time for adding gain within a short time. Therefore the sawtooth signal or clip wave may happen such as the schematic diagram shown in FIG. 1, and a lot of noises (101) are produced. If the intensity is fluctuated around the maximum upper threshold, the mentioned sawtooth signal or clip wave will be periodically produced and make people feel uncomfortable.

FIG. 2 is a waveform diagram of the noise produced by the conventional automatic gain-control mechanism within a release time. This diagram shows a portion of the FIG. 1. Apparently, the release time is entered for increasing the gain to the predetermined gain after the hold time holds for a while. Since the sound is fluctuated around the maximum upper threshold, the crackle may be met soon and the next attack time is entered for gradually decreasing the gain, in order to avoid exceeding the maximum upper threshold.

SUMMARY OF THE INVENTION

Provided is a mechanism of automatic gain modulation, which provides an audio device functioning the automatic gain-control (AGC) to have better quality of playback and recording. The provided AGC mechanism can prevent the noise caused by switching between the release time and the attack time in a short time especially as the intensity of input sound fluctuates around the upper threshold. The present invention is preferably applied to game consoles, game software, audio playback and recording devices, analog-to-digital converter (ADC/DAC), microphones and other like devices which need to prevent the noise caused by audio gain adjustment. One of the embodiments of the gain automatic modulation in accordance with present invention firstly receives signals, and preferably the audio signals. The method then samples the signals. Under the usual automatic gain-control mechanism, the original signal will be added by a fixed gain which is a positive value or a negative value, and a new signal is obtained. After that, the method is to determine whether the intensity of new signal is greater than a maximum upper threshold, which is generally the upper threshold of crackle.

If the intensity of new signal is not greater than the maximum upper threshold, the current automatic gain-control is still used to process the output signal. The method continuously receives signals. On the other hand, if the intensity of new signal is greater than the maximum upper threshold, the enhanced automatic gain-control mechanism is activated. In the meantime, an attack time is entered and the gain for the new signal is gradually decreased automatically till the intensity is small or equal to the maximum upper threshold.

The process then enters a hold time, where the gain does not change. In accordance with the present invention, the method pre-adds a predict gain so as to predict the intensity and determine whether the later intensity of signal is greater than a predetermined threshold. If the intensity with pre-added gain is greater than the predetermined threshold, the method then determines whether the intensity with pre-added gain is greater than the maximum upper threshold. If the intensity with pre-added gain is still greater the maximum upper threshold, the attack time is entered for gradually decreasing the gain. At this moment, the intensity with pre-added gain will be greater than the predetermined threshold, but not greater than the maximum upper threshold. That is, the steps keep the process within the hold time.

While the process is in the hold time, if the intensity with pre-added gain is not greater than the predetermined threshold, the automatic gain-control procedure will make the process enter the release time after the process keeps in the hold time for a while. The gain is gradually increased in the release time till the intensity with gain increment is not greater than the maximum upper threshold. Therefore, the gain can be restored to the original under the usual automatic gain-control mechanism, that is, the signal intensity is equal to the original gain added by the fixed gain (positive or negative value) provided by the usual automatic gain-control mechanism. It is noted that the signals with gain increment or decrement are simultaneously outputted, and the method keeps on receiving signals while gain modulation.

BRIEF DESCRIPTION OF THE DRAWINGS

The foregoing aspects and many of the attendant advantages of this invention will be more readily appreciated as the same becomes better understood by reference to the following detailed description, when taken in conjunction with the accompanying drawings, wherein.

DETAILED DESCRIPTION OF THE PREFERRED EMBODIMENTS

One of the major features of the automatic gain-control is to provide a mechanism that makes the signaling process immediately enter an attack time when a crackle is detected. The gain is gradually decreased as entering the attack time. After a specific time, the process enters a hold time and the gain is fixed in this period. A release time is then entered for gradually increasing the gain after a further period. Therefore, the gain can be restored to the value under an original operation.

The major purpose of the automatic gain-control mechanism is to prevent audio intensity from a crackle as exceeding a maximum upper threshold by means of automatic gain modulation. Preferably, the major way is to monitor the signals. When the sampled signal exceeds the maximum upper threshold, the process can immediately enter the attack time for automatically decreasing the gain. This mechanism pulls back the signals since the signal may exceed the maximum upper threshold, in order to avoid continuous crackles.

However, if the peak of audio intensity continuously appears around the maximum upper threshold, the automatic gain increment will often produce crackle. Even though the automatic gain-control mechanism can immediately make the process enter the attack time, the crackle may happen next time by the gradual increased gain within the next release time. Under this situation, the audio signal will be unstable or make listener uncomfortable since the signal fluctuates around the upper threshold by the automatic gain modulation.

Figure 1:
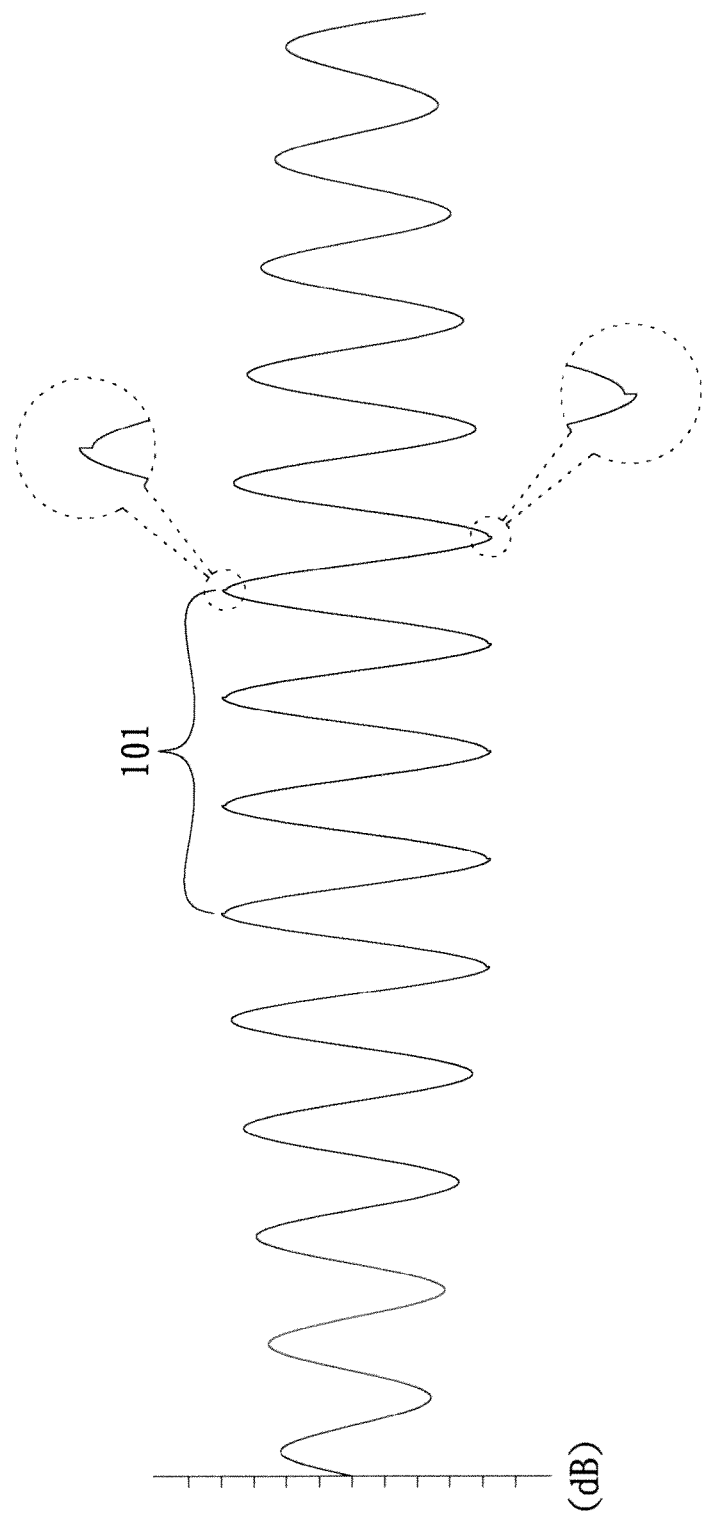
FIG. 1 shows a chart of the signal processed by a conventional automatic gain-control technology.
Figure 2:
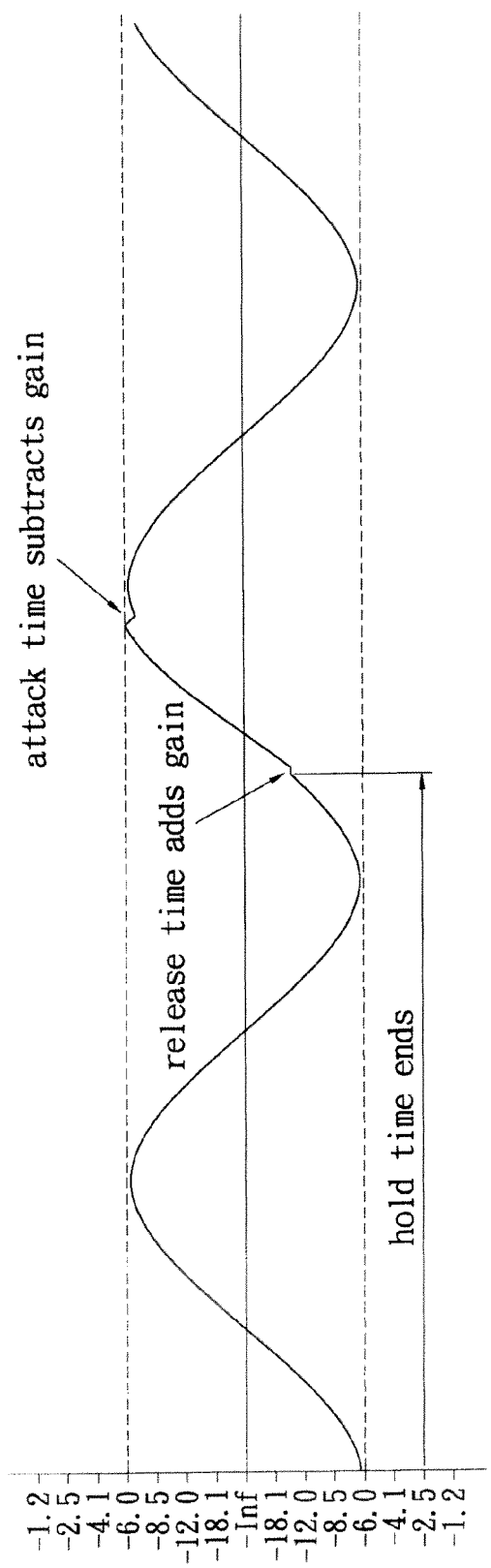
FIG. 2 is a waveform diagram showing a noise occurred within the release time of the conventional automatic gain-control mechanism.
Figure 3A:
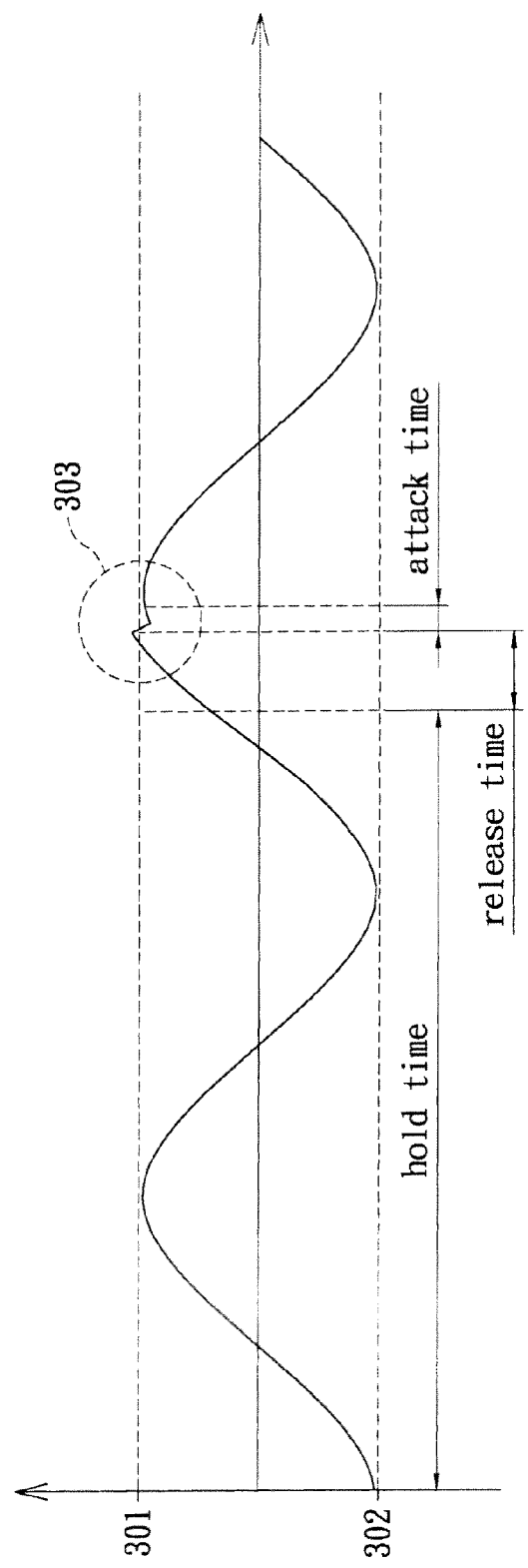
FIG. 3A is a waveform diagram under the conventional automatic gain-control mechanism.

Reference is made to FIG. 3A showing a signal waveform chart under the conventional automatic gain-control mechanism. The shown wave represents the continuous output signals. The vertical axis indicates the maximum upper-limit as 301 and 302, and the crackle may happen since the signal exceeds the maximum upper threshold. Although the wave of initial signals rise and fall, the gain has no modulation within a hold time. After entering a release time, the gain is gradually increased. As the signal is modulated by the gradual increasing gain, the signal may meet a sawtooth phenomenon such as the crackle 303 shown in the diagram. The process immediately enters an attack time for decreasing the gain. In the diagram, there is an exemplary example appearing a sharp decline waveform. Further reference is made to FIG. 2.

Figure 3B:
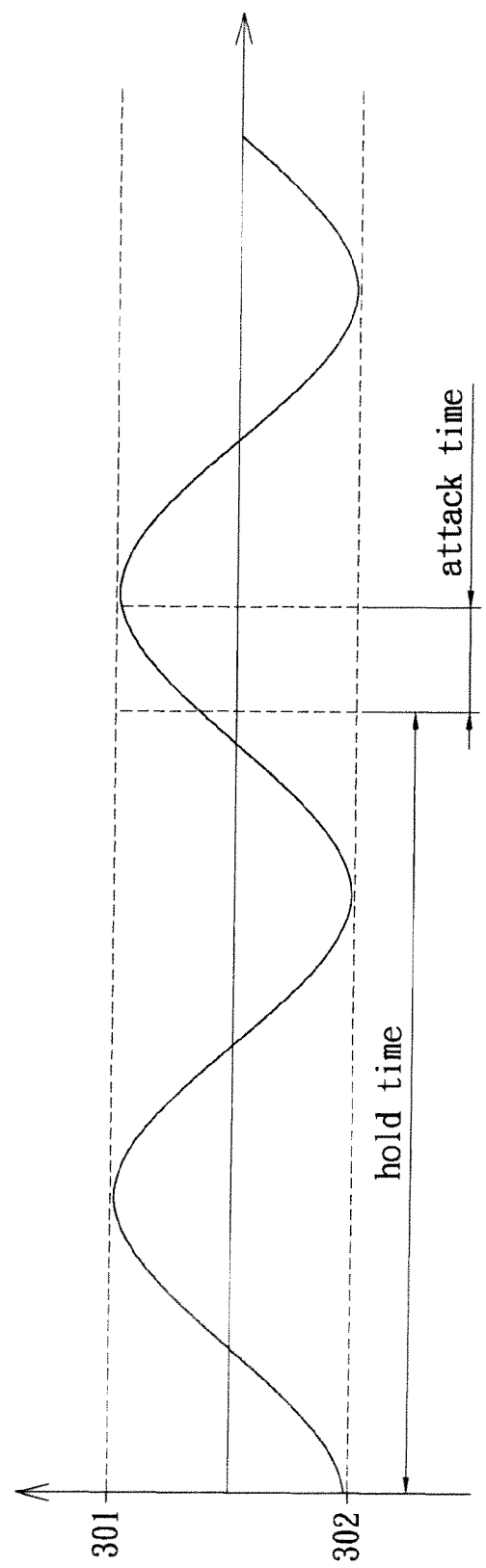
FIG. 3B is a waveform diagram processed by the automatic gain-control mechanism in accordance with the present invention.

The signaling waveform processed under the automatic gain-control mechanism is referred to the diagram in FIG. 3B. It is particularly to predict the signal intensity at next time by pre-adding a gain, and the signal can be limited below a specific threshold in order to avoid the crackle. Furthermore, the claimed feature can eliminate harsh sound caused by the continuous crackle formed by the continual gain modulation using automatic gain-control, which is performed on the signal around the upper threshold within a certain period of time.

Figure 3C:
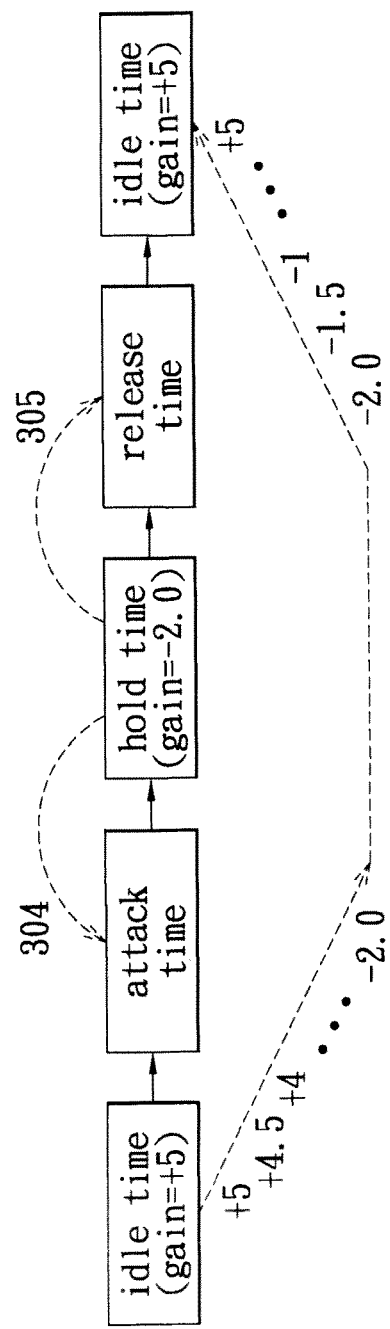
FIG. 3C is a schematic diagram showing the changes of gain as entering an attack time, a hold time, and a release time.

Reference is made to FIG. 3C showing the change of gain while entering an attack time, a hold time, and a release time. Generally, the related system stays at an idle state before the common automatic gain-control mechanism is activated. The gain may be kept as a constant value in the meantime. When the signal exceeds a maximum upper threshold, the automatic gain-control starts.

Such as the example shown in figure, the gain is +5 at idle time. When the automatic gain-control is activated, the attack time is entered. The dotted line shown in figure illustrates the gain's change. At the moment, the gain is gradually decreased by 0.5 from the original +5 to +4.5, +4 and further to a predetermined low limit (gain=−2.0), that is entering the hold time.

After entering the hold time, the gain keeps unchanged, that is −2.0 in this example. After a period of time (about micro-second), the release time is entered. The gain is gradually increased within the release time, and the gain is +0.5 in this example. So that, the gain is changed from −2.0, −1.5, and −1.0 to +5.0, which is the predetermined upper threshold and the process enters the idle state.

More particularly, the automatic gain-control mechanism in accordance with the present invention provides a scheme of pre-adding a predict gain within the hold time in order to determine if the signal exceeds the maximum upper threshold at next time. That is also to determine whether the crackle will be produced at the next time. After the prediction, if the crackle may be produced, the mechanism will force the process enter the attack time, such as the execution direction presented by the dotted line 304 in the figure. If the crackle may not be produced after prediction, the standard automatic gain-control procedure is processed, and enters the release time after a while. The execution direction presented by the dotted line 305 is the process within release time.

Figure 4:
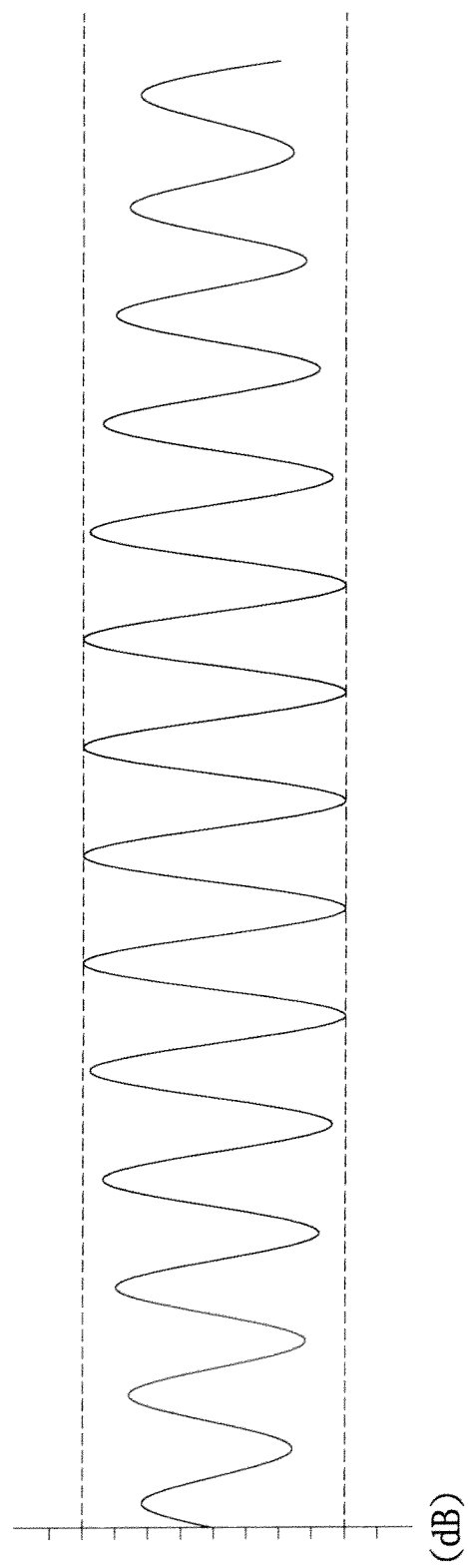
FIG. 4 is a chart showing the signal processed by the automatic gain modulation in accordance with the present invention.

The method of automatic gain modulation in accordance with the present invention particularly incorporates a mechanism which uses a predict gain added on the intensity during the hold time. It is featured that a feedback mechanism in entered to determine whether or not the process enters the release time from the current hold time. A modifiable predict gain is used to predict the audio intensity at the next time. If the predicted intensity is greater than a predetermined upper threshold, the process enters the attack time immediately in order to decrease the gain. Therefore, the audio intensity can be limited under the maximum upper threshold, and the mechanism prevents the process from frequently cycling change among the hold time, release time, and the attack time. The mechanism also reduces the times of automatic gain control around the upper threshold. Therefore, the claimed mechanism can function to reduce the sawtooth noise and clip wave. A signal chart of the signal processed by the automatic gain modulation is shown in FIG. 4. The present invention can prevent the crackle as the input signals fluctuate around the limit values by the claimed mechanism.

The mentioned modifiable predict value indicative of "Pre_Threshold" is equal to the value as the maximum upper threshold indicative of "Threshold" subtracts a predict gain indicatively of "pre_gain". The predict value is formulated as:

Pre_Threshold=Threshold−pre_gain

Figure 5:
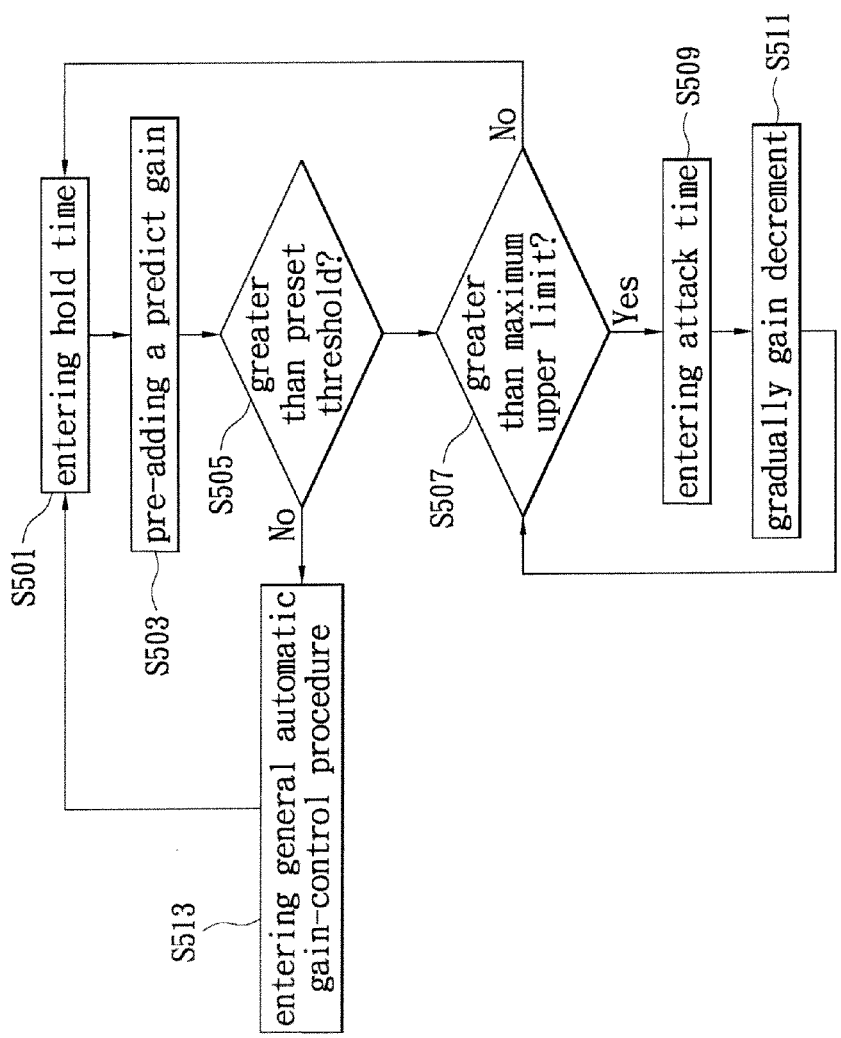
FIG. 5 is a flow chart illustrating an aspect of the method of automatic gain modulation of the present invention.

FIG. 5 is a flow chart illustrates the aspect of the method of automatic gain modulation using a gain pre-adding scheme in accordance with present invention. The practical implement is not limited to the audio signal.

According to the flow chart, it illustrates the scheme to determine the timing of entering an attack time, a hold time, and a release time. In the beginning, an audio device, such as an audio output device or a recording device, receives original signals. The system introduces a gain and samples the signals. The sampled audio signals undergo the automatic gain modulation process, and, in the meantime, gain modulation is performed as well as outputting the modulated signals.

In step S501, the procedure enters the hold time in the beginning. A gain for the system can be a positive value or a negative value. Under the claimed automatic gain-control mechanism, the sampled signal is pre-added by a predict gain firstly (step S503). Then a new signal for prediction is obtained. It is determined that whether the intensity of new signal is greater than a predetermined threshold set by a system (step S505). This predetermined threshold is used to limit a range for gain modulation and can be a value smaller than a maximum upper threshold, which is an upper threshold around a crackle.

If the answer is no in step S505, it shows the signal processed by pre-adding the predict gain is not greater than the predetermined threshold. After the gain is pre-added by the predict gain, the intensity of audio signal will not be greater than the predetermined threshold. Therefore, the output audio may not produce the crackle. As in step S513, the method enters a general automatic gain-control procedure. The gain, in the meantime, is modulated in accordance with the automatic gain-control mechanism. For example, as the process enters the release time from the hold time, the gain is gradually increased. After an idle period, the process enters the hold time in step S501, and performs the automatic gain modulation in accordance with the present invention.

After the determination in step S505, if the answer is affirmative, the intensity of signal modulated with pre-added gain is greater than the predetermined threshold. The process further determines whether the intensity is greater than the maximum upper threshold (step S507). The maximum upper threshold is the upper threshold as the system produces the unstable signal. The invention introduces this maximum upper threshold to determine the timing of entering the attack time. If the answer is negative, it shows the process is kept within the hold time since the signal modulated by the pre-added gain is greater than the predetermined threshold but not than the maximum upper threshold (step S501). The process continuously uses the pre-adding gain scheme to determine if any unstable signal exists.

If the signal modulated by the pre-added gain meets the maximum upper threshold, it shows the predicted signal is not only greater than the predetermined threshold, but also than the maximum upper threshold. The prediction shows the signal at next time may exceed the maximum upper threshold after gain modulation, so that the process enters the attack time (step S509). Immediately, the current gain is modulated by gradual gain decrement (step S511). Next, the method goes back to step S507 in order to determine whether the signal under gradual gain decrement is still greater than the maximum upper threshold till the intensity of signal is smaller or equal to the maximum upper threshold. After that, the process enters the hold time from the attack time (step S501).

More particularly, the mentioned predict gain and the gain with the gradual gain decrement within the attack time are the modifiable values on demand, and a difference there-between can be a fixed value delta. The related embodiment can be referred to FIG. 6.

Following table shows an exemplary example. There sets a maximum upper threshold at 100 (unit is preferably dB), for example. When the process enters the hold time, it means the procedure performing the automatic gain modulation of the present invention. The current gain is −2 (preferable unit is dB), and the predict gain is +3. The predetermined threshold is 95, and the input volumes are exemplarily 100, 90, and 95 after entering the hold time.

|  | Input value (enter hold time) | | |
| --- | --- | --- | --- |
|  | 100 | 90 | 95 |
| Pre-adding +3 | 103 | 93 | 98 |
| Greater or equal to predetermined threshold 95 | Yes | No | Yes |
| Greater or equal to the max upper threshold 100 | Yes | N/A | No |
| State | Attack time | Usual automatic gain-control (Release time) | Hold time |
| Gain modulation | Current −2 Continuous decrement afterward | Current −2 Continuous increment afterward | −2 |
| Output | 98 (100 − 2) | 88 (90 − 2) | 93 (95 − 2) |

According to the above exemplary data, if the input signal is 100 and the signal is pre-added by a predict gain +3, the signal will be greater than both predetermined threshold 95 and the maximum upper threshold 100. In the meantime, the system automatically enters an attack time, and the signal will be outputted after being modulated by the original system gain −2. After that, the signal is further processed by gain modulation within the attack time. Furthermore, if the input signal is 90 and pre-added by +3, the signal with pre-added gain is not greater than the predetermined threshold 95 or the maximum upper threshold 100, a general automatic gain-control procedure is entered. If the input signal is 95 and pre-added by +3, this signal with pre-added gain is greater than the predetermined threshold 95, but not greater than the maximum upper threshold 100. The process will be kept within the hold time and the prediction process for the intensity is continued. It is still to determine the timing of entering the release time and the attack time.

Figure 6:
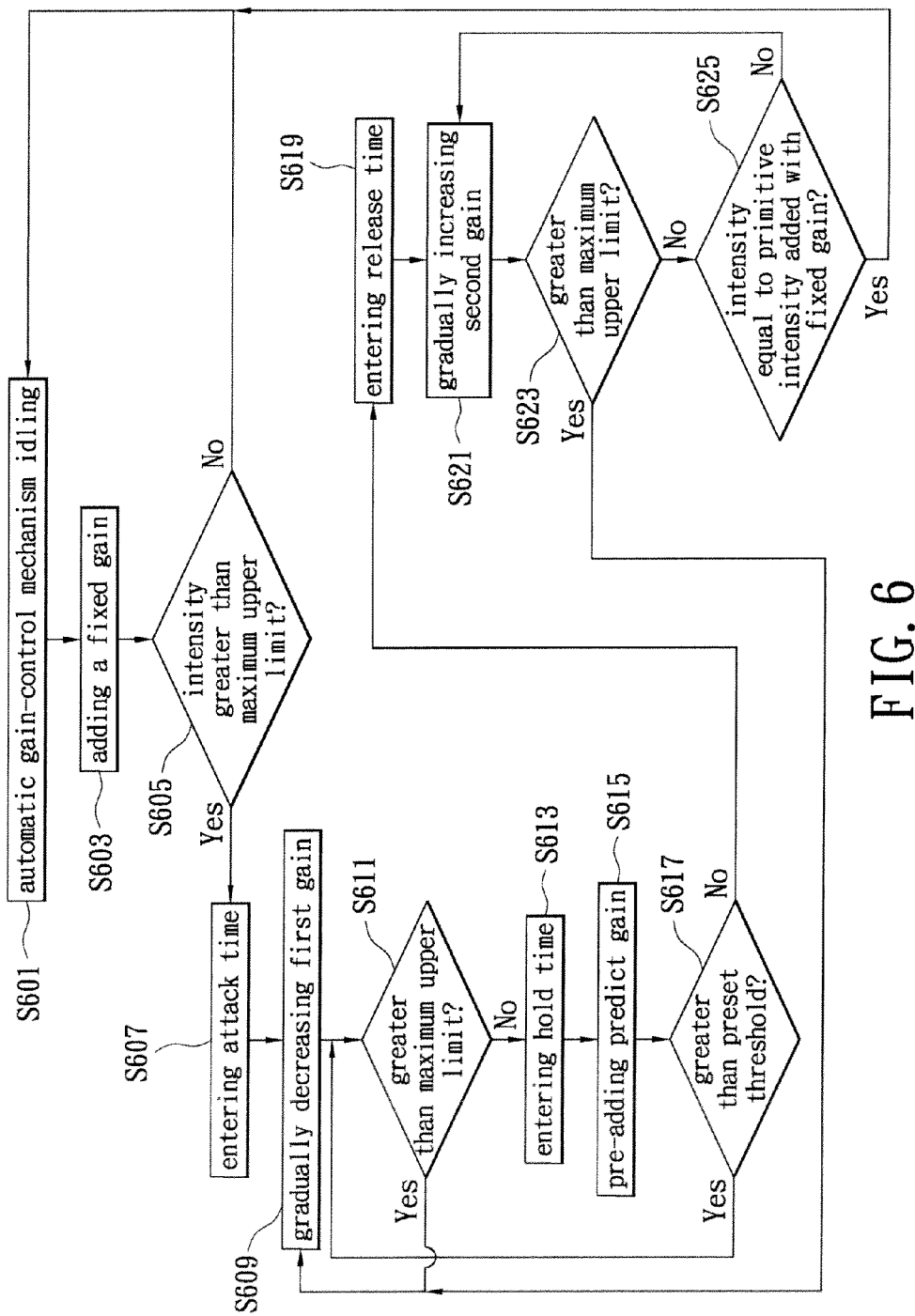
FIG. 6 shows a flow chart of the method of the automatic gain modulation of the embodiment of the present invention.

FIG. 6 shows a flow chart of the method of automatic gain modulation in accordance with the present invention. This figure illustrates the change of signal intensity processed by the automatic gain-control mechanism in the method.

In step S601, the system with an automatic gain-control mechanism is under an idle state in the beginning. That is the state as the intensity of received original signal does not meet the maximum upper threshold. In the meantime, the general automatic gain modulation mechanism is entered to output a fixed gain on the original signal. This fixed gain can be a positive value or a negative value. Then a new signal after modulation is obtained (step S603). When the system is under the idle state, the related audio or other signal is continuously outputted under a common condition. At this moment, the system determines that the intensity of the new signal us greater than the maximum upper threshold which may cause crackle (step S605). That is to determine if any sawtooth phenomena happens, such as the crackle. If the crackle is produced, the automatic gain-control mechanism is activated immediately. Such as step S607, an attack time is entered for gradually decreasing a first gain (step S609). During the attack time, the signals are continuously outputted after the gain modulation. If the intensity of new signal is not greater than the maximum upper threshold, the step in the method keeps on receiving the signals (step S601).

In accordance with the present invention, in order to prevent outputting the crackle before the claimed automatic gain-control mechanism is initiated, a limiter is introduced to limit the output signal as the intensity is greater than the maximum upper threshold. This limiter can prevent outputting the initial signals from exceeding the maximum upper threshold.

During the attack time, such as the step S607, the method of automatic gain modulation continuously determines whether the signal after gradual gain decrement is greater than the maximum upper threshold (step S611). If the signal is still greater than the maximum upper threshold, the method goes on the step S609 for gradually decreasing the first gain till the modulated signal is not greater than the maximum upper threshold. Similarly, the signals are still outputted by the gain modulation within the attack time. If the intensity of signal is smaller or equal to the maximum upper threshold, the process enters the hold time, such as the step S613. The method of automatic gain-control of the present invention is incorporated during the hold time, and the gain will be kept as a constant. During the hold time, the method uses a pre-adding scheme to add a predict gain on the signal for prediction (step S615). The signal after pre-adding the predict gain will be fed back for deciding a suitable gain.

As an example of playing the audio, the step of sampling may delay a sample, and pre-adding a predict gain on the sampled signal in order to predict if the signal at next time is greater than a predetermined threshold (step S617). The predetermined threshold is particularly used to limit the upper threshold of the output signal, such as the value less small than the maximum upper threshold. If the signal with pre-added gain is still greater than the predetermined threshold, the method goes back to step S611 which is to determine whether the signal is greater than the maximum upper threshold. In the meantime, if the signal with pre-added gain is also greater than the maximum upper threshold, the method goes back to the step S609 and enters the attack time. During the attack time, the original signal without pre-adding any gain is gradually decreased by the first gain, which has different meaning from the mentioned predict gain. By the modulation using the first gain, the signal will be modulated till the intensity is not greater than the maximum upper threshold. Next, the method enters the hold time.

In step S617, if the process is in hold time, and the signal with pre-adding the predict gain is not greater than the predetermined threshold, the method enters the release time which processes the general automatic gain-control mechanism (step S619). In next step S621, the gain is modulated by gradually increasing a second gain. During the release time, the gain is gradually increased, and the signal is continuously outputted after gain modulation.

Next, such as step S623 in the release time, it is determined that whether the intensity of the signal under the modulation by gradually increasing the gain is greater than the maximum upper threshold. If the intensity of signal is greater than the maximum upper threshold, it shows a crackle may happen, and turns back to step S609 and enters the attack time. The gain is gradually decreased by the first gain during the attack time. If the intensity of signal modulated by gradually increasing the gain in the release time is not greater than the maximum upper threshold (branch "no"), the method goes to step S625 for determining if the intensity of signal is equal to the original intensity added with the fixed gain (step S625). This step is to restore the gain to the original fixed gain by gradually increasing the gain during release time, such as the illustration in step S603. After the determination in step S625, if the answer is affirmative, the process goes to the beginning step S601, or the process goes back to step S621 for continuously increasing the second gain. Through the repeated steps of gradually increasing and decreasing gain and employing the limit of the predetermined threshold, the output audio will not have the continual crackles, especially under the condition of the signal fluctuating around the maximum upper threshold.

Consequently, the gain modulated by gradual gain increment in the release time can make the intensity of signal equal to the original intensity added with the fixed gain. The method then goes back to beginning step S601. Otherwise, the process should stay in the release time for gradually increasing the second gain (step S621), and determine whether the intensity of signal is greater than the predetermined threshold (step S623), or alternatively, the method goes to modulate the gain in the attack time.

It is noted that the signal can be the audio signal received by an audio device. The automatic gain-control mechanism introduces a positive or negative gain to modulate the audio signal. The above-mentioned predict gain for predicting the intensity, the first gain used in attack time, the second gain used in release time, and the predetermined threshold for defining the upper threshold and modifiable on demand. The first gain and the second gain can be the same value. More particularly, the predetermined threshold is a value less small than the maximum upper threshold approaching the crackle. The threshold can limit the signal within a safe range. Through the scheme of prediction in the present invention, the phenomena of crackle as the signal unexpectedly exceeds the upper threshold The above-described invention can also be applied to the sound-recording technology. The quality of recording can be better by the automatic gain modulation since the recording process may meet an unexpected big sound that scares the listener. The claimed automatic gain-control mechanism can exclude the unexpected situation.

In summation of the above description, the method of automatic gain modulation in the present invention further incorporates a prediction scheme to predict if any sawtooth phenomenon may happen at next time. The claimed mechanism can prevent the improper output signal.

The above-mentioned descriptions represent merely the preferred embodiment of the present invention, without any intention to limit the scope of the present invention thereto. Various equivalent changes, alternations or modifications based on the claims of present invention are all consequently viewed as being embraced by the scope of the present invention.

What is claimed is:

1. A method of automatic gain modulation, comprising:
receiving an original signal and introducing a gain;
sampling the original signal;
pre-adding a predict gain and obtaining a new signal for prediction;
determining whether intensity of the new signal for prediction after pre-adding the predict gain during a hold time is greater than a predetermined threshold or not;
when the intensity of the new signal is not greater than the predetermined threshold, a signal processed by an automatic gain-control modulation on the original signal is outputted;
when the intensity of the new signal for prediction is greater than the predetermined threshold, it is to determine whether the intensity of the new signal is greater than a maximum upper threshold;
when the intensity of the new signal is not greater than the maximum upper threshold, a signal processed by the automatic gain-control modulation on the original signal is outputted; and
when the intensity of the new signal is greater than the maximum upper threshold, the gain is gradually decreased, and a signal processed by a gain-control modulation on the original signal is outputted.

2. The method of claim 1, wherein the signal is an audio signal received by an audio device.

3. The method of claim 1, wherein the predict gain, the gain, and the predetermined threshold are modifiable on demand.

4. The method of claim 3, wherein the predetermined threshold is a value smaller than the maximum upper threshold.

5. The method of claim 4, wherein the maximum upper threshold is an upper value close to a crackle.

6. The method of claim 3, wherein the gain is a positive value or a negative value.

7. The method of claim 1, wherein the method enters a release time when the intensity of the new signal for prediction is not greater than the predetermined threshold.

8. The method of claim 1, wherein the method enters an attack time when the intensity of the new signal is greater than the predetermined threshold and the maximum upper threshold.

9. The method of claim 1, wherein the method enters a hold time when the intensity of the new signal is greater than the predetermined threshold but not greater than the maximum upper threshold.

10. An automatic gain modulation, comprising:
receiving an original signal;
sampling the original signal obtaining a new signal when the original signal is processed by an automatic gain-control mechanism by introducing a fixed gain;
determining whether intensity of the new signal is greater than a maximum upper threshold after the original signal is modulated by adding the fixed gain or not;
keeping receive and output the signal when the intensity of the new signal is not greater than the maximum upper threshold;
when the intensity of the new signal is greater than the maximum upper threshold, an attack time is entered, and the intensity of the new signal is gradually decreased by a first gain, and the modulated signal is outputted;
determining whether the intensity of the new signal after modulation by gradually decreasing the first gain is greater than the maximum upper threshold or not;
when the intensity of the new signal is greater than the maximum upper threshold within the attack time, the intensity is gradually decreased by the first gain and the modulated signal is outputted till the modulated signal is not greater than the maximum upper threshold;
when the intensity of the new signal is not greater the maximum upper threshold within the attack time, a hold time is entered;
pre-adding a predict gain on the modulated signal as entering the hold time;
determining whether the intensity after pre-adding the predict gain is greater than a predetermined threshold or not;
when the intensity after pre-adding the predict gain is greater than the predetermined threshold, it is to determine whether the intensity after pre-adding the predict gain is greater than the maximum upper threshold, and the gain is modulated by the first gain till the intensity is not greater than the maximum upper threshold;
when the intensity after pre-ad ding the predict gain is not greater than the predetermined threshold, a release time is entered after holding a period of time so as to gradually increase a second gain, and output the signal after modulation;
determining whether the signal after gradually increasing the second gain is greater than the maximum upper threshold or not;
when the signal under the gain modulation after gradually increasing the second gain is greater than the maximum upper threshold, the attack time is entered, and the gain is modulated by gradually decreasing the first gain, and the signal is outputted; and
when the signal after gradually increasing the second gain is not greater than the maximum upper threshold, and the intensity is equal to the original signal added with the fixed gain, signal processed by the gain modulation as gradually increasing the gain is outputted and the signal is continuously received.

11. The method of claim 10, wherein the fixed gain is a positive value or a negative value.

12. The method of claim 10, if the intensity of new signal modulated by referring to the fixed gain is not greater than the maximum upper threshold, the automatic gain-control mechanism is under an idle state.

13. The method of claim 10, if the intensity of signal processed by the fixed gain modulation is greater than the maximum upper threshold, a limiter is 23 utilized to limit the output signal so as to prevent the intensity from exceeding the maximum upper threshold.

14. The method of claim 10, if the intensity of signal processed by the gain modulation is not equal to the original signal with added the fixed gain; the step of gradually increasing the second gain in the release time goes on.

15. The method of claim 10, wherein the gain after gradually decreased does not change as entering the hold time.

16. The method of claim 10, wherein the predetermined threshold is a value smaller than the maximum upper threshold, and the predetermined threshold is used to limit the output signal within a range.

17. The method of claim 10, wherein the method of automatic gain modulation is applied to an audio device, and the signal is received audio signal.

18. The method of claim 10, wherein the predict gain, the first gain, the second gain, and the predetermined threshold are modifiable on demand.

19. A device applying the method of automatic gain modulation recited in claim 10.

* * * * *